US009825226B2

(12) United States Patent
Yun et al.

(10) Patent No.: US 9,825,226 B2
(45) Date of Patent: Nov. 21, 2017

(54) METHOD FOR CONTROLLING AN INCREASE IN CONDUCTIVITY OF A POLYMER THIN-FILM TO PROVIDE A CONDUCTIVE FILM

(71) Applicant: ELECTRONICS AND TELECOMMUNICATIONS RESEARCH INSTITUTE, Daejeon (KR)

(72) Inventors: Sun Jin Yun, Daejeon (KR); Changbong Yeon, Namyangju-si (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/957,316

(22) Filed: Dec. 2, 2015

(65) Prior Publication Data

US 2016/0163426 A1 Jun. 9, 2016

(30) Foreign Application Priority Data

Dec. 3, 2014 (KR) .................. 10-2014-0172111
Nov. 25, 2015 (KR) .................. 10-2015-0165496

(51) Int. Cl.
*H01L 51/00* (2006.01)
*G06F 3/041* (2006.01)

(52) U.S. Cl.
CPC .......... *H01L 51/0021* (2013.01); *G06F 3/041* (2013.01); *G06F 2203/04103* (2013.01)

(58) Field of Classification Search
CPC .................. H01L 31/1884; G06F 3/041
See application file for complete search history.

(56) References Cited

U.S. PATENT DOCUMENTS

| 4,251,575 A * | 2/1981 | Brady ........... C08J 7/12 |
| | | 427/341 |
| 4,959,121 A * | 9/1990 | Dumas ........... C08G 73/1003 |
| | | 205/164 |
| 6,309,694 B1 | 10/2001 | Ryu et al. |
| 2010/0089872 A1 * | 4/2010 | Ihara ........... H01L 21/32134 |
| | | 216/83 |
| 2011/0133607 A1 | 6/2011 | Lee et al. |

(Continued)

FOREIGN PATENT DOCUMENTS

| KR | 10-2012-0077870 A | 7/2012 |
| WO | WO-2012/158125 A1 | 11/2012 |

OTHER PUBLICATIONS

Haixin Chang et al., "A Transparent, Flexible, Low-Temperature, and Solution-Processible Graphene Composite Electrode", Advanced Functional Materials, vol. 20, pp. 2893-2902, Jul. 13, 2010.

(Continued)

*Primary Examiner* — Duy Deo
(74) *Attorney, Agent, or Firm* — Rabin & Berdo, P.C.

(57) ABSTRACT

Provided is a method for manufacturing a conductive film. The method for manufacturing a conductive film includes providing a polymer thin-film on a base film, treating the polymer thin-film by using 10 M to 15 M of nitric acid, and washing the polymer thin-film treated with nitric acid. The nitric acid treatment is performed at room temperature for about 7 minutes to about 13 minutes.

19 Claims, 3 Drawing Sheets

(56) References Cited

U.S. PATENT DOCUMENTS

2012/0168682 A1 7/2012 Kim et al.
2012/0168685 A1* 7/2012 Kim .......................... C08J 7/14
252/500

OTHER PUBLICATIONS

Seyul Kim et al., "Highly reliable AgNW/PEDOT:PSS hybrid films: efficient methods for enhancing transparency and lowering resistance and haziness", Journal of Materials Chemistry C, vol. 2, pp. 5636-5643, May 15, 2014.
Wen-Bin Liu et al., "Fabrication of a large-area, flexible and color-neutral single-wall carbon nanotube:sodium dodecylbenzene sulfonate/poly-(3,4-ethylenedioxythiophene): poly(4-styrenesulfonate) transparent conductive film having a new conduction mechanism", Science Direct, pp. 1-8, Dec. 2014.

* cited by examiner

METHOD FOR CONTROLLING AN INCREASE IN CONDUCTIVITY OF A POLYMER THIN-FILM TO PROVIDE A CONDUCTIVE FILM

CROSS-REFERENCE TO RELATED APPLICATIONS

This U.S. non-provisional patent application claims priority under 35 U.S.C. §119 of Korean Patent Applications No. 10-2014-0172111, filed on Dec. 3, 2015 and No. 10-2015-0165496, field on Nov. 25, 2015, respectively, the entire contents of which are hereby incorporated by reference.

BACKGROUND

The present disclosure herein relates to a method for manufacturing a conductive film, and more particularly, to a method for manufacturing a conductive film used as a transparent electrode.

Polymer thin films such as polyethylene dioxythiophene/polystyrene sulfonate (poly(3,4-ethylenedioxythiophene):poly(styrenesulfonate) (PEDOT:PSS)) have been actively employed as a transparent electrode of transparent and flexible elements or organic elements requiring a low temperature deposition process.

However, PEDOT:PSS itself generally has conductivity of about 1 S/cm which is much low conductivity compared to that of a metal electrode. It is difficult to apply such low conductivity to devices, so that studies for increasing conductivity of PEDOT:PSS polymer film have been actively conducted.

SUMMARY

Embodiments of the inventive concepts may provide methods for manufacturing a conductive film having high conductivity.

An embodiment of the inventive concept provides a method for manufacturing a conductive film. The method for manufacturing a conductive film includes: providing a polymer thin-film on a base film; treating the polymer thin-film with nitric acid having concentration of 10 M to 15 M; and washing the polymer thin-film treated with nitric acid, wherein the nitric acid treatment is performed at room temperature for about 7 minutes to about 13 minutes.

In an embodiment, the polymer thin-film may have conductivity of about 0.5 S/cm to about 1.5 S/cm before the nitric acid treatment, and the polymer thin-film may have conductivity of about 3,500 S/cm to about 4,000 S/cm after the nitric acid treatment.

In an embodiment, the base film may be transparent and flexible.

In an embodiment, the polymer thin-film may include at least one of a polythiophene-based, polypyrrole-based, polyphenylene-based, polyaniline-based or polyacetylene-based material.

In an embodiment, the polymer thin-film may include polyethylene dioxythiophene/polystyrene sulfonate (PEDOT:PSS).

In an embodiment, the polymer thin-film treated with nitric acid may be washed with water.

In an embodiment of the inventive concept, provided is a method for manufacturing a conductive film. The method for manufacturing a conductive films includes: providing a polymer thin-film on a base film; treating the polymer thin-film with nitric acid having concentration of 3 M to 15 M; and washing the polymer thin-film treated with nitric acid, wherein the nitric acid treatment is performed at room temperature for about 7 minutes to about 13 minutes, and conductivity of the polymer thin-film may be changed depending on the nitric acid concentration In an embodiment, when the polymer thin-film is treated with nitric acid having concentration of 3 M, the polymer thin-film may have conductivity of about 1,600 S/cm, and, when the polymer thin-film is treated with nitric acid having concentration of 14 M, the polymer thin-film may have conductivity of about 4,000 S/cm.

In an embodiment, the polymer thin-film may include polyethylene dioxythiophene/polystyrene sulfonate (PEDOT:PSS).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
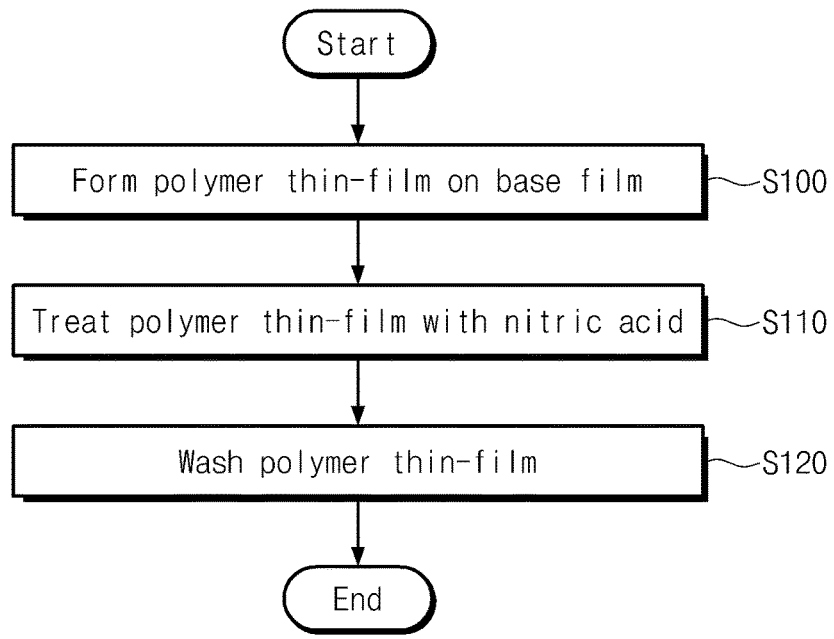
FIG. 1 is a flow chart to illustrate a method for manufacturing a conductive film according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In this description, when an element is referred to as being 'on' another element, it can be directly on the other element, or intervening elements may also be present therebetween. In the drawings, the thickness of elements are exaggerated for clarity of illustration The embodiments of the inventive concept will be described with reference to ideal and exemplary sectional views and/or plan views. In the drawings, the thickness of layers and regions are exaggerated for clarity of illustration of technical feature. Therefore, the forms of the exemplary drawings may be changed due to manufacturing technology and/or error tolerance. Thus, embodiments of the inventive concept are not limited to certain depicted forms rather include changed forms due to the manufacturing process. For example etching regions depicted as a right angle may be round or a form having certain curvature. Therefore, the exemplify regions on the drawings has attributes, and the shapes of the exemplified regions illustrate specific shapes of the regions of elements and are not construed to limit the scope of the invention. The terms "first" and "second" used in various embodiments of the specification are used to describe various elements, but the elements should not be limited by the term. These terms are only used to distinguish an element from other elements. The embodiments described and exemplified herein include complementary embodiments thereof.

The terminology used herein is not for delimiting the present invention, but for describing the embodiments. In the specification, the terms of a singular form may include plural forms unless otherwise specified. The term "comprise" and/or "comprising" used herein does not mean that the mentioned element excludes presence or addition of one or more other elements.

Hereinafter, exemplary embodiments of the inventive concept will be described in detail with reference to the accompanying drawings.

FIG. 1 is a flow chart to illustrate a method for manufacturing a conductive film according to an embodiment of the inventive concept.

Referring to FIG. 1, a polymer thin-film is provided on a base film (step S100). The base film may include first and second surfaces facing each other, and the polymer thin-film may be provided on the first and second surfaces.

The base film may be made of plastic (e.g. a polymer film) which is transparent and modifiable by external forces. For example, the base film may be made of various resins such as polyimide (PI), polycarbonite (PC), polyethyleneterephtalate (PET), polyethersulfone (PES), polythylenenaphthalate (PEN), and fiber reinforced plastic (FRP). For the base film, materials having flexible characteristic, such as a glass thin-film (thin glass) or metal thin-film (metal foil), are available in addition to the plastic.

According to an embodiment of the inventive concept, the polymer thin-film may include at least one of polyethylene, polythiophene, polypyrrole, polyphenylene, polyaniline or polyacetylene. For example, the polymer thin-film may include polyethylene dioxythiophene/polystyrene sulfonate (poly(3,4-ethylenedioxythiophene):poly(styrenesulfonate) (PEDOT:PSS)). Conductivity of the polymer thin-film may be about 0.5 S/cm to about 1.5 S/cm.

The polymer thin-film may be treated with nitric acid ($HNO_3$) having concentration of 10 M to 15 M (step S110). In the case where the concentration of nitric acid is lower than 10 M, the polymer thin-film may not show desired conductivity, and in the case where the concentration of nitric acid is greater than 15 M, the polymer thin-film may be damaged. More preferably, the concentration of nitric acid may be about 14 M.

According to an embodiment of the inventive concept, nitric acid treatment of the surface of the polymer thin-film may performed at room temperature. In other word, the nitric acid treatment may be performed without heat. After nitric acid treatment of the surface of the polymer thin-film, conductivity of the polymer thin-film may be about 3,500 S/cm to about 4,000 S/cm.

According to an embodiment, the time of nitric acid treatment may be about 7 minutes to about 13 minutes. Although detailed description is provided hereinafter, when time of nitric acid treatment is about 7 minutes or less, conductivity of the polymer thin-film may not be increased to a desired level. Moreover, even when the time of nitric acid treatment is increased to about 13 minutes or more, conductivity of the polymer thin-film is not increased, but the polymer thin-film may be damaged in the case of being exposed to nitric acid for a long period of time. More preferably, the time of nitric acid treatment may be about 10 minutes.

In an embodiment, the concentration of nitric acid is between about 13.5 M to 14 M, and the polymer thin-film may be treated with nitric acid having such concentration for about 10 minutes. In this case, after the surface of the polymer thin-film is treated with nitric acid, conductivity of the polymer thin-film may be about 4,000 S/cm. Conductivity of about 4,000 S/cm corresponds to a resistivity value of about $3 \times 10^{-4}$ Ωcm.

As such, the polymer thin-film having high conductivity may be formed without deformation of the polymer thin-film due to high concentration of nitric acid by treating the surface of the polymer thin-film with nitric acid having high concentration for a short period of time without heat.

Sequentially, a conductive film may be formed by washing the polymer thin-film treated with nitric acid using water (step S120) and then drying the film.

Figure 2:
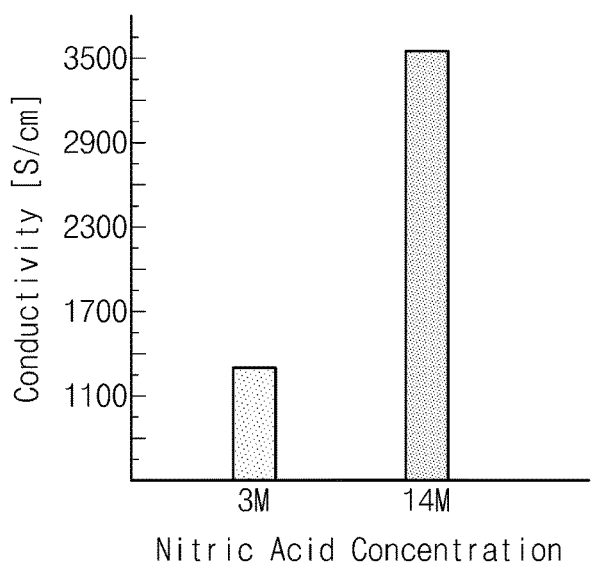
FIG. 2 is a graph showing conductivity after the polymer thin-films are respectively treated with 3 M nitric acid and 14 M nitric acid.
Figure 3:
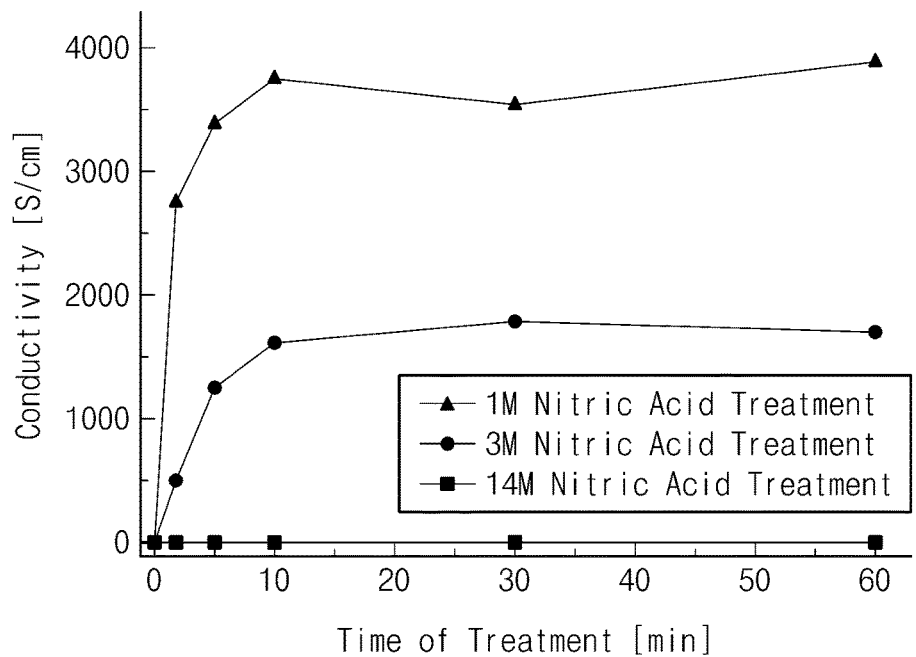
FIG. 3 is a graph showing conductivity depending on time of treating the polymer thin-films respectively with 1 M nitric acid 3 M nitric acid and 14 M nitric acid.

FIG. 2 is a graph showing conductivity after polymer thin-films treated with 1 M nitric acid, 3 M nitric acid and 14 M nitric acid. FIG. 3 is a graph showing conductivity depending on time of treating polymer thin-films respectively with 3 M and 14 M nitric acid.

Polymer thin-films having the thickness of about 100 nm are prepared. Each of the polymer thin-film includes PEDOT:PSS. Polymer thin-films are respectively treated with nitric acid having concentration of 3 M and nitric acid having concentration of 14 M.

Referring to FIG. 2, the result is obtained by treating the polymer thin-films for about 5 minutes with nitric acid having concentration of 3 M or nitric acid having concentration of 14 M, and then measuring conductivity of the polymer thin-films. After treatment with the nitric acid having concentration of 3 M, conductivity of the polymer thin-film may be about 1,600 S/cm. After the polymer thin-film is treated with the nitric acid having concentration of 14 M, conductivity of the polymer thin-film may be about 3,500 S/cm.

As such, conductivity of the polymer thin-film may be adjusted depending on concentrations of nitric acid, so that the polymer thin-film may be applied to various elements.

Referring to FIG. 3, the result is obtained by measuring conductivity of polymer thin-films depending on nitric acid treatment time. When the polymer thin-film is treated with nitric acid having concentration of 1 M, it has been found that conductivity does not increase even with lapse of the time. During about 10 minutes of treatment of a polymer thin-film with nitric acid having concentration of 3 M, conductivity increases with lapse of time. Then, after about 10 minutes, conductivity reaches about 1,600 S/cm, and does not increase even though time passes further. It can be found that it is not possible to obtain conductivity of about 2,000 S/cm or more even after the polymer thin-film is treated with nitric acid having concentration of 3 M or less for about 10 minutes or more.

When a polymer thin-film is treated with the nitric acid having concentration of 14 M for about 10 minutes, conductivity significantly increases with lapse of time. Then, after about 10 minutes, conductivity reaches the highest point of about 4,000 S/cm, and then, after about 10 minutes or more, the conductivity is declined to about 3,500 S/cm and maintained within margin of testing error. Thus, to obtain a polymer thin-film having high conductivity, treatment should be performed with nitric acid having concentration of 10 M or more. In addition, nitric acid treatment to the polymer thin-film is efficient when the treatment is performed at room temperature for about 7 minutes to about 13 minutes.

Figure 4:
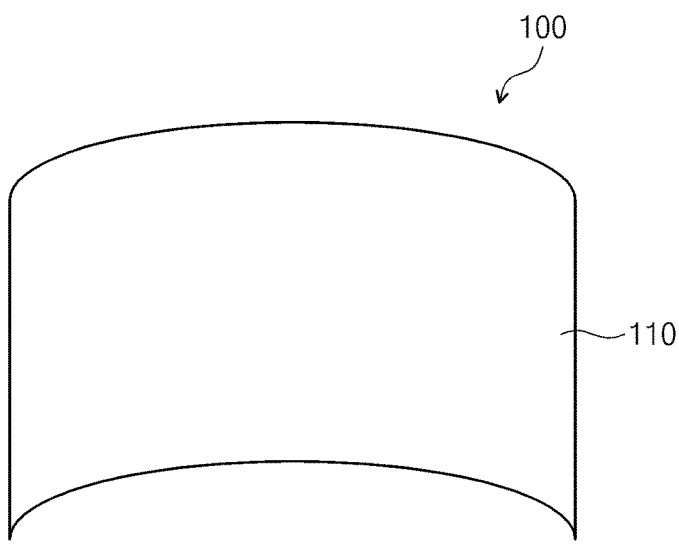
FIG. 4 is a perspective view to illustrate a flexible display device according to an embodiment of the inventive concept.
Figure 5:
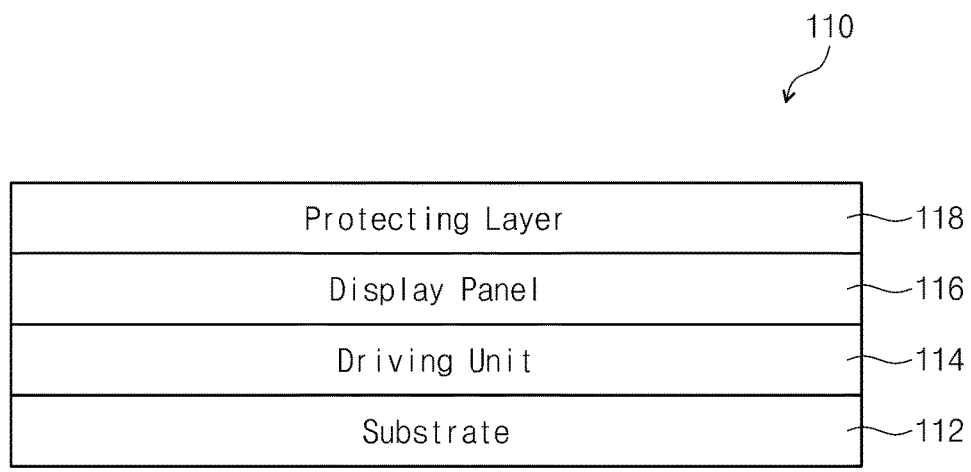
FIG. 5 is a cross sectional view to illustrate a configuration of a display unit of the flexible display device according to an embodiment of the inventive concept.

FIG. 4 is a perspective view to illustrate a flexible display device according to an embodiment of the inventive concept, and FIG. 5 is a cross sectional view to illustrate a configuration of a display unit of the flexible display device according to an embodiment of the inventive concept.

Referring to FIGS. 4 and 5, the display device 100 may include a display unit 110 and a control unit (not shown). Referring to FIG. 5, the display unit 110 having flexible characteristic may include a substrate 112, a driving unit 114, a display panel 116, and a protecting layer 118.

The flexible display device 100 indicates a device which may be bent, crooked, folded or rolled such as papers while display characteristics of typical planar display devices are maintained intact. Therefore, the flexible display device 100 may be manufactured on the flexible substrate 112. Specifically, the substrate 112 may be made of a plastic substrate (e.g. a polymer film) which is modifiable by external forces. The plastic substrate 112 may have a structure in which both faces of a base material (base film) have barrier coating. The base material may be made of various resins such as polyimide (PI), polycarbonite (PC), polyethyleneterephtalate (PET), polyethersulfone (PES), polythylenenaphthalate (PEN), and fiber reinforced plastic (FRP). According to an embodiment of the inventive concept, the barrier coating is performed on surfaces of the base material facing each other, and may include at least one of polyethylene, polythiophene, polypyrrole, polyphenylene, polyaniline or polyacetylene in order to maintain flexibility. Moreover, by treating the barrier coating with nitric acid having concentration of about 3 M to 15 M as described in FIG. 1, it is possible to obtain desirable conductivity. After the nitric acid treatment, the substrate including the barrier coating may have conductivity of about 1,600 to about 4,000 S/cm.

Meanwhile, for the substrate 112, materials having flexible characteristic, such as a glass thin-film (thin glass) or metal thin-film (metal foil), are available in addition to the plastic substrate.

The driving unit 114 has a function of driving the display panel 116. Specifically, the driving unit 114 may be configured to apply driving voltage to a plurality of pixels constituting the display panel 116, and be made of amorphous silicon thin film transistor (a-Si TFT), low temperature poly silicon (LTPS), TFT, or organic TFT (OTFT). The driving unit 1114 may be implemented in various forms depending on implemented forms of the display panel 116.

In an example, the display penal 116 may include an organic light emitter having a plurality of pixel cells and an electrode layer covering both faces of the organic light emitter. In this case, the driving unit may include a plurality of transistors corresponding to each of pixel cells of the display panel 116. The control unit is configured to apply an electronic signal to a gate of each transistor, to thereby allow a pixel cell coupled to the transistor to emit light. Accordingly, it is possible to display various screens. In another example, in addition to the organic light emitting diode, the display panel 116 may be made of EL, electrophoretic display (EPD), electrochromic display ECD, liquid crystal display (LCD), AMLCD, plasma display panel (PDP), etc. Only for LCD, separate backlight is required due to the lack of self illumination. LCD, where backlight is not employed, surrounding light is used. Thus, to use an LCD display panel without backlight, conditions such as outdoor environment providing a great amount of light should be satisfied.

The protecting layer 118 has a function of protecting the display panel 116. For example, in the protecting layer 118, materials such as ZrO, $CeO_2$, and $ThO_2$ are available. The protecting layer 118 may be manufactured in a form of transparent film to cover the whole surface of the display panel 116.

On the other hand, the display unit 110 may be made of an electronic paper. The electronic paper is display device, in which general characteristic of ink is applied to a paper, and differs from the general planar display in terms of using reflected light. Meanwhile, the electronic paper may alter a picture or letter through electrophoresis using a capsule or twist ball.

In embodiments according to the inventive concept, the polymer thin-film having high conductivity may be formed by treating the polymer thin-film with high concentration of nitric acid. Further, through short-time treatment with high concentration of nitric acid, the polymer thin film may be prevented from being modified and processing time may be reduced.

In addition, the polymer thin-film having desired conductivity may be formed by adjusting concentration of nitric acid, and be used in various elements.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for providing a conductive film by controlling an increase in conductivity of a polymer thin-film provided on a base film, the method consisting essentially of:
   providing a pure nitric acid aqueous solution consisting of nitric acid and water having a concentration of nitric acid of 10 M to 15 M;
   treating said polymer thin-film with the pure nitric acid aqueous solution at room temperature for about 7 minutes to about 13 minutes;
   washing the polymer thin-film after treating with the pure nitric acid aqueous solution; and
   drying the polymer thin-film after washing to provide said conductive film,
   wherein the conductivity of the polymer thin-film is increased depending on the nitric acid concentration.

2. The method of claim 1, wherein the polymer thin-film has a conductivity of about 0.5 S/cm to about 1.5 S/cm before treating with the pure nitric acid aqueous solution, and the polymer thin-film has a conductivity of about 3,500 S/cm to about 4,000 S/cm after treating with the pure nitric acid aqueous solution.

3. The method of claim 1, wherein the base film is transparent and flexible.

4. The method of claim 1, wherein the polymer thin-film comprises at least one of polyethylene, polythiophene, polypyrrole, polyaniline or polyacetylene.

5. The method of claim 1, wherein the polymer thin-film comprises polyethylene dioxythiophene/polystyrene sulfonate (poly(3,4-ethylenedioxythiophene):poly(styrenesulfonate) (PEDOT:PSS)).

6. The method of claim 1, wherein washing the polymer thin-film after treating with the pure nitric acid aqueous solution is performed with water.

7. The method of claim 1, wherein the pure nitric acid aqueous solution has a concentration of 14 M to provide a conductivity of about 4,000 S/cm.

8. A method for providing a conductive film by controlling an increase in conductivity of a polymer thin-film comprised of a conductive polymer having a conductivity of about 0.5 S/cm or more provided on a base film, the method consisting essentially of:
providing a pure nitric acid aqueous solution consisting of nitric acid and water having a concentration of nitric acid of 10 M to 15 M;
treating said polymer thin-film with the pure nitric acid aqueous solution at room temperature for about 7 minutes to about 13 minutes;
washing the polymer thin-film after treating with the pure nitric acid aqueous solution; and
drying the polymer thin-film after washing to provide said conductive film,
wherein the conductivity of the polymer thin-film is increased depending on the nitric acid concentration.

9. The method of claim 8, wherein the polymer thin-film has a conductivity of about 0.5 S/cm to about 1.5 S/cm before treating with the pure nitric acid aqueous solution, and the polymer thin-film has a conductivity of about 3,500 S/cm to about 4,000 S/cm after treating with the pure nitric acid aqueous solution.

10. The method of claim 8, wherein the base film is transparent and flexible.

11. The method of claim 8, wherein the conductive polymer having a conductivity of about 0.5 S/cm or more comprises at least one of a polyethylene, a polythiophene, a polypyrrole, a polyaniline and a polyacetylene.

12. The method of claim 8, wherein the conductive polymer having a conductivity of about 0.5 S/cm or more comprises polyethylene dioxythiophene/polystyrene sulfonate (poly(3,4-ethylenedioxythiophene):poly(styrenesulfonate) (PEDOT:PSS)).

13. The method of claim 8, wherein washing the polymer thin-film after treating with the pure nitric acid aqueous solution is performed with water.

14. The method of claim 8, wherein the pure nitric acid aqueous solution has a concentration of 14 M to provide a conductivity of about 4,000 S/cm.

15. A method for providing a conductive film by controlling an increase in conductivity of a polymer thin-film comprised of a conductive polymer having a conductivity of about 0.5 S/cm or more that is a polyethylene dioxythiophene/polystyrene sulfonate (poly(3,4-ethylenedioxythiophene):poly(styrenesulfonate) (PEDOT:PSS)) on a base film, the method consisting essentially of:
providing a pure nitric acid aqueous solution consisting of nitric acid and water having a concentration of nitric acid of 10 M to 15 M;
treating said polymer thin-film with the pure nitric acid aqueous solution at room temperature for about 7 minutes to about 13 minutes;
washing the polymer thin-film after treating with the pure nitric acid aqueous solution; and
drying the polymer thin-film after washing to provide said conductive film,
wherein the conductivity of the polymer thin-film is increased depending on the nitric acid concentration.

16. The method of claim 15, wherein the polymer thin-film has a conductivity of about 0.5 S/cm to about 1.5 S/cm before treating with the pure nitric acid aqueous solution, and the polymer thin-film has a conductivity of about 3,500 S/cm to about 4,000 S/cm after treating with the pure nitric acid aqueous solution.

17. The method of claim 15, wherein the base film is transparent and flexible.

18. The method of claim 15, wherein washing the polymer thin-film after treating with the pure nitric acid aqueous solution is performed with water.

19. The method of claim 15, wherein the pure nitric acid aqueous solution has a concentration of 14 M to provide a conductivity of about 4,000 S/cm.

* * * * *